United States Patent
Kwon et al.

(10) Patent No.: US 8,868,001 B2
(45) Date of Patent: Oct. 21, 2014

(54) SCHEME FOR MONITORING BATTERY OF MACHINE TYPE COMMUNICATION DEVICE

(75) Inventors: Hyeyeon Kwon, Daejeon (KR); Kyung Yul Cheon, Daejeon (KR); Mi Jeong Yang, Daejeon (KR); Aesoon Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 772 days.

(21) Appl. No.: 13/100,775

(22) Filed: May 4, 2011

(65) Prior Publication Data

US 2011/0275328 A1   Nov. 10, 2011

(30) Foreign Application Priority Data

May 4, 2010   (KR) ................. 10-2010-0042078
Apr. 18, 2011  (KR) ................. 10-2011-0035715

(51) Int. Cl.
| | | |
|---|---|---|
| *H04B 17/00* | (2006.01) | |
| *H04B 1/16* | (2006.01) | |
| *H04B 1/38* | (2006.01) | |
| *H04M 1/00* | (2006.01) | |
| *G01R 31/36* | (2006.01) | |

(52) U.S. Cl.
CPC ................... *G01R 31/3689* (2013.01)
USPC ............. 455/67.11; 455/574; 455/343.1

(58) Field of Classification Search
CPC . H04W 24/10; H04W 52/02; H04W 52/0235; G01R 31/318575
USPC ........ 455/67.11, 69, 574, 343.1, 343.2, 343.5
See application file for complete search history.

(56) References Cited

U.S. PATENT DOCUMENTS

| | | | | |
|---|---|---|---|---|
| 7,346,331 | B2 * | 3/2008 | Taylor et al. | 455/343.5 |
| 8,255,716 | B2 * | 8/2012 | Mandyam | 713/320 |
| 8,335,548 | B2 * | 12/2012 | Kuwana | 455/574 |
| 2002/0094849 | A1 * | 7/2002 | Cannon et al. | 455/573 |
| 2003/0135773 | A1 * | 7/2003 | Zhang et al. | 713/340 |
| 2003/0137277 | A1 * | 7/2003 | Mori et al. | 320/132 |
| 2004/0180701 | A1 * | 9/2004 | Livet et al. | 455/574 |
| 2004/0242286 | A1 * | 12/2004 | Benco et al. | 455/574 |
| 2008/0049653 | A1 * | 2/2008 | Demirhan et al. | 370/311 |
| 2008/0268917 | A1 * | 10/2008 | Chang et al. | 455/574 |
| 2009/0232036 | A1 * | 9/2009 | Marx | 370/311 |

* cited by examiner

*Primary Examiner* — Andrew Wendell
(74) *Attorney, Agent, or Firm* — NSIP Law

(57) ABSTRACT

Provided is a machine type communication system including a machine type communication device operating with a battery. The machine type communication system may monitor a residual power of the battery supplying power to the machine type communication device, and may output the monitored residual power to a device of a manager that manages the machine type communication device. Also, a point in time when the residual power of the battery is to be monitored may be determined based on the residual power.

6 Claims, 4 Drawing Sheets

SCHEME FOR MONITORING BATTERY OF MACHINE TYPE COMMUNICATION DEVICE

CROSS-REFERENCE TO RELATED APPLICATION

This application claims the benefit of Korean Patent Application Nos. 10-2010-0042078, filed on May 4, 2010 and 10-2011-0035715, filed on Apr. 18, 2011, the entire disclosures of which are incorporated herein by reference.

BACKGROUND OF THE INVENTION

1. Field of the Invention

The present invention relates to a method of monitoring a battery lifespan of a machine type communication device, and more particularly, to technology of preventing a communication disconnection occurring due to battery consumption by checking a battery lifespan of a device in a network.

2. Description of the Conventional Art

Currently, machine type communication technologies, for example, Machine Type Communication (MTC) or Machine to Machine (M2M) that may be employed for smart metering of remotely controlling a gas meter reader or a water gauge reader, for remotely controlling an automatic vending machine, and the like, are becoming important issues.

A machine type communication service is a service for exchanging information between machine devices or between a machine device and a user. Machine type communication may be applied to a field in which periodical communication is required, however, an amount of data to be transmitted is small. For example, a safety diagnostic apparatus may be installed in each corresponding portion of a bridge to inspect the safety of the bridge and the like. Each safety diagnostic apparatus may transmit a safety diagnosis result to an application server using machine type communication devices. The machine type communication may be performed using a specially developed device and server, for example, a communication device of which a data rate is not relatively high and the like.

In the case of a machine type communication device installed in an isolated area, for example, a bridge, the riverside, and the like, for measuring the quantity of water or monitoring the quality of water, an access of a human being may not be required except for a case where a burglary prevention or a maintenance and repair is required. Accordingly, until that no response is from a machine type communication device is monitored, even though a battery of the machine type communication device is out, the machine type communication device may be unattended whereby connection may be cut off.

SUMMARY OF THE INVENTION

An aspect of the present invention provides a method that may measure a residual power of a battery of a machine type communication device and thereby prevent unpredicted communication disconnection.

Another aspect of the present invention provides a method that may determine a point in time when a residual power of the battery of a machine type communication device is to be measured.

According to an aspect of the present invention, there is provided an operation method of a machine type communication device operating using a power stored in a battery, the method including: receiving, from a network apparatus, a residual power monitoring request with respect to the battery; monitoring a residual power of the battery in response to the residual power monitoring request; transmitting the monitored residual power of the battery to the network apparatus in response to the residual power monitoring request; and receiving again a residual power monitoring request from the network apparatus based on the monitored residual power.

According to another aspect of the present invention, there is provided an operation method of a network apparatus operating in a network including at least one machine type communication device, the method including: transmitting, to a machine type communication device, a residual power monitoring request with respect to a battery of the machine type communication device at a point in time for monitoring a residual power with respect to the machine type communication device; receiving the residual power of the battery from the machine type communication device in response to the residual power monitoring request; and retransmitting, to the machine type communication device, a residual power monitoring request with respect to the battery based on the residual power of the battery.

According to still another aspect of the present invention, there is provided an operation method of a network apparatus operating in a network including at least one machine type communication device, the method including: predicting an operable time duration in which a machine type communication device operating with a battery is operable using a residual power of the battery, with respect to the machine type communication device; setting a predetermined point in time within the operable time duration to a monitoring time; transmitting, to the machine type communication device at the set monitoring time, a residual power monitoring request with respect to the battery; and receiving, from the machine type communication device in response to the residual battery monitoring request, the residual power of the battery monitored at the monitoring time.

According to embodiments of the present invention, there may be provided a method that may measure a residual power of the battery of a machine type communication device and thereby prevent unpredicted communication disconnection.

According to embodiments of the present invention, there may be provided a method that may determine a point in time when a residual power of the battery of a machine type communication device is to be measured.

DETAILED DESCRIPTION OF THE PREFERRED EMBODIMENT

Figure 1:
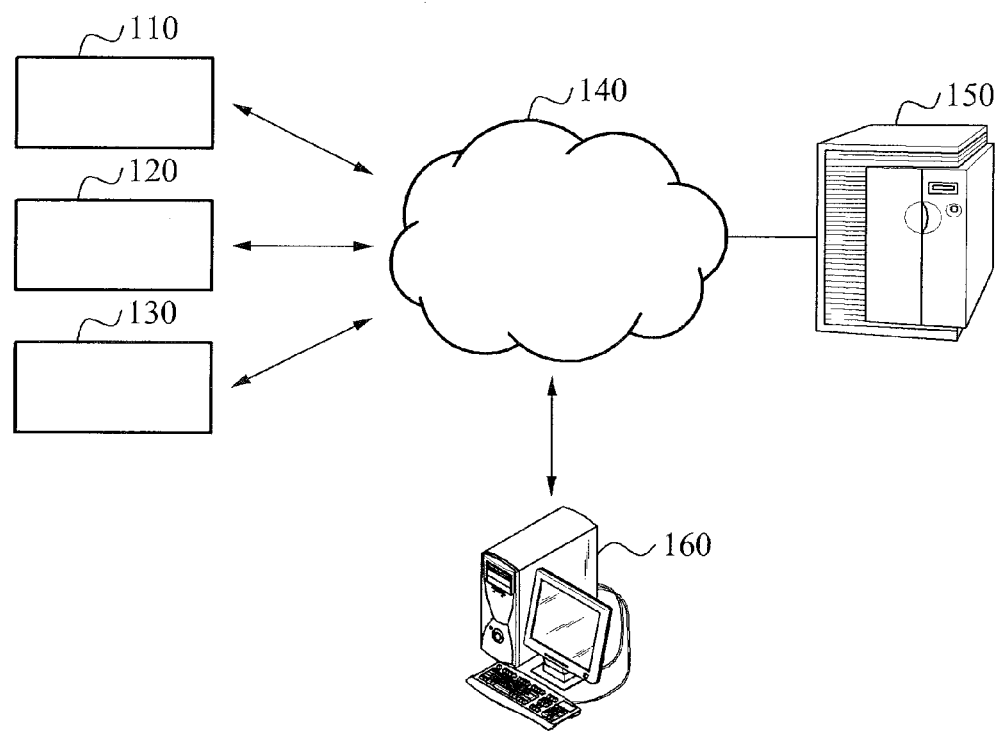
FIG. 1 is a diagram illustrating a machine type communication system according to an embodiment of the present invention.

Example embodiments will now be described more fully with reference to the accompanying drawings.

Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

The terminology used here is for describing particular example embodiments only and is not intended to be limiting. As used here, the singular forms "a", "an", and "the" are intended to include plural forms as well unless the context clearly indicates otherwise. It will be further understood that the terms "comprises, "comprising", "includes", and/or "including" when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms such as those defined in commonly used dictionaries, should be interpreted as having a meaning that is consistent with their meaning in the context of the relevant art and should not be interpreted in an idealized or overly formal sense unless expressly so defined herein.

The term "device" used in the present specification may be referred to as a mobile terminal or a mobile apparatus, a mobile station (MS), a user equipment (UE), a user terminal (UT), a wireless terminal, an access terminal (AT), a terminal, a subscriber unit, a subscriber station (SS), a wireless device, a wireless communication device, a wireless transmit/receive unit (WTRU), a mobile node, a mobile, or other terminals. Various embodiments of the device may include a cellular phone, a smart phone having a wireless communication function, a personal digital assistant (PDA) having a wireless communication function, a wireless modem, a portable computer having a wireless communication function, a photographing apparatus such as a digital camera having a wireless communication function, a gaming apparatus having a wireless communication function, a music storing and playing electronic product having a wireless communication function, an Internet electronic product enabling an wireless Internet access and browsing, a portable unit integrating combinations of corresponding functions, or a small sensor of a predetermined purpose and apparatuses, however is not intended to be limiting.

The term "network apparatus" used in the present specification may generally denote a fixed network point for communication with a terminal. The network apparatus may also be referred to as a base station, a node base (Node-B), an evolved Node-B (eNode-B), a base transceiver system (BTS), an access point, and the like.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

FIG. 1 is a diagram illustrating a machine type communication system according to an embodiment of the present invention.

Referring to FIG. 1, a machine type communication device 110 may refer to a single or a plurality of terminals installed in an isolated area for diagnosing the safety of a bridge, monitoring the quality of water, and the like. Each of machine type communication devices 110, 120, and 130 may refer to an apparatus that may implement a predetermined duty and communicate the implementation result with a machine type communication server 150 and other machine type communication devices via a communication network 140. In addition, each of the machine type communication devices 110, 120, and 130 may refer to a data collection apparatus and an apparatus positioned in an end for a machine type communication network, with a sensor and a communication function and positioned.

In general, the machine type communication devices 110, 120, and 130 may be installed at home, such as a water gauge reader, an electric meter reader, or in a place where the infrastructure is well developed. Also, in many cases, the machine type communication devices 110, 120, and 130 may be installed in a dangerous area, for example, a field, a bridge, and the like, for measuring the quality of water, measuring an environmental pollution, and the like, or in the outskirts where people may not readily access. In this case, except for a burglary detection or a maintenance and repair, an access of a human being may not be required.

The machine type communication devices 110, 120, and 130 may operate using power stored in a battery. When the power stored in the battery is all consumed, the machine type communication devices 110, 120, and 130 may not further operate. Until that no response is from the machine type communication devices 110, 120, and 130 is monitored, even though a lifespan of the battery is out, the machine type communication devices 110, 120, and 130 may be unattended and thus, it may be difficult to collect proper information. Accordingly, a manager of the machine type communication devices 110, 120, and 130 may need to replace the battery with a new battery before the battery is all discharged.

According to an aspect, it is possible to predict a battery lifespan of each of the machine type communication devices 110, 120, and 130, and to replace the battery of each of the machine type communication devices 110, 120, and 130 before the battery lifespan is out. However, the battery lifespan may be variable due to environmental elements.

According to an aspect, each of the machine type communication devices 110, 120, and 130 may measure a residual power of the battery and transmit the measured residual power to a manager device 160 via the communication network 140.

A manager managing the machine type communication devices 110, 120, and 130 may receive a report about the residual power of the battery of each of the machine type communication devices 110, 120, and 130, and may replace the battery of each of the machine type communication devices 110 based on the reported residual power of the battery.

Figure 2:
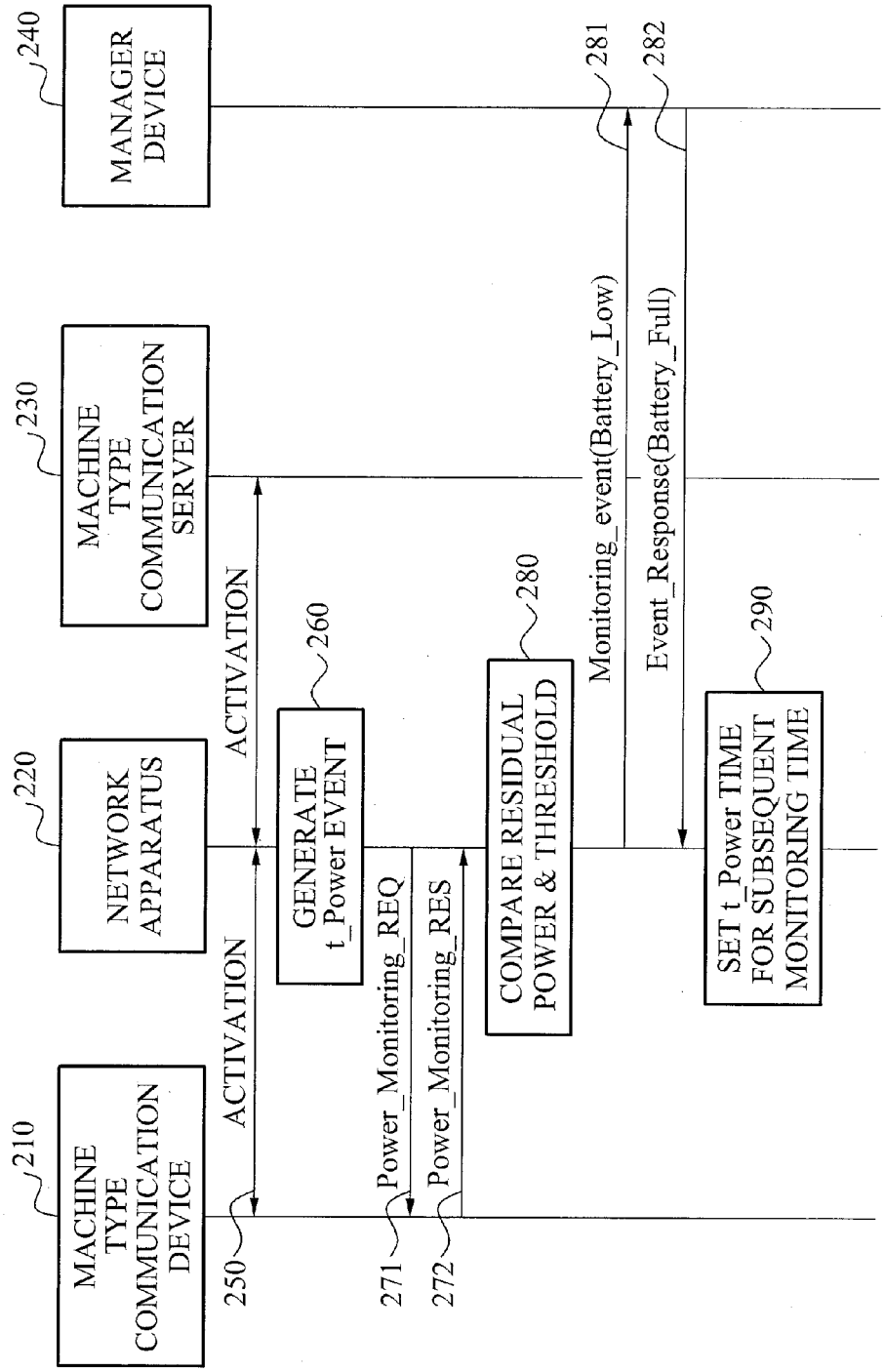
FIG. 2 is a diagram illustrating an operation of a machine type communication system according to an embodiment of the present invention.

FIG. 2 is a diagram illustrating an operation of a machine type communication system according to an embodiment of the present invention.

In operation 250, the machine type communication system including a machine type communication device 210, a network apparatus 220, a machine type communication server 230, and a manager device 240 may be activated. When the machine type communication system is activated, the machine type communication device 210 may implement a predetermined duty and may transmit the implementation result to the machine type communication server 230 via the network apparatus 220. When the machine type communication device 210 implements the predetermined duty, power stored in a battery of the machine type communication device 210 may be consumed and residual power of the battery may decrease. In operation 260, the network apparatus 260 may generate a t_Power event. The t_Power event may correspond to an event notifying a point in time that is predetermined to monitor the residual power of the battery of the machine type communication device 210. According to an aspect, the network apparatus 220 may determine a monitoring time based on a probable minimum threshold of the battery of the machine type communication device 210 and a corresponding lifespan of the battery. The monitoring time may be set again based on the residual power of the battery.

In operation 271, the network apparatus 220 may transmit, to the machine type communication device 210, a residual power monitoring request Power_Monitoring_REQ with respect to the battery of the machine type communication device 210.

The machine type communication device 210 may monitor the residual power of the battery, and may transmit the monitored residual power of the battery to the network apparatus 220 in operation 272. According to an aspect, the machine type communication device 210 may include the monitored residual power of the battery in a monitoring response Power_Monitoring_RES and thereby transmit the same.

In operation 280, the network apparatus 220 may compare the received residual power of the battery with a predetermined threshold. According to an aspect, the threshold to be compared with the residual power may correspond to a minimum value of battery power with which the machine type communication device 210 may stably operate. When the residual power is greater than or equal to the threshold, it may indicate that the residual power of the battery is sufficient and thus, there is no need to monitor the residual power of the battery for a relatively long period of time. Conversely, when the residual power is less than the threshold, it may indicate that there is a need to prepare for a probability that the battery may be all consumed.

When the residual power of the battery is less than the threshold, the network apparatus may transmit the monitoring result Monitoring_event, for example, Battery_Low, to the manager device 240 in operation 281. A manager managing the machine type communication device 210 or the network apparatus 220 may verify that the residual power of the battery of the machine type communication device 210 is less than the threshold using the manager device 240.

According to an aspect, the manager may replace the battery of the machine type communication device 210 with a new battery, or may charge the battery. In this case, the residual power of the battery of the machine type communication device 210 may be recovered to be greater than or equal to the threshold.

When the residual power of the battery of the machine type communication device 210 is recovered to be greater than or equal to the threshold, the manager device 240 may transmit an event response Event_Response, for example, Battery_Full, in operation 282.

In operation 290, the network apparatus 220 may set a subsequent point in time when residual power of the battery of the machine type communication device 210 is to be monitored. According to an aspect, the network apparatus 220 may predict a time duration in which the machine type communication device 210 is operable using the residual power of the battery of the machine type communication device 210 reported in operation 272, may set, as a subsequent monitoring time, a predetermined point in time within the predicted time duration, and may store the set point in time.

Figure 3:
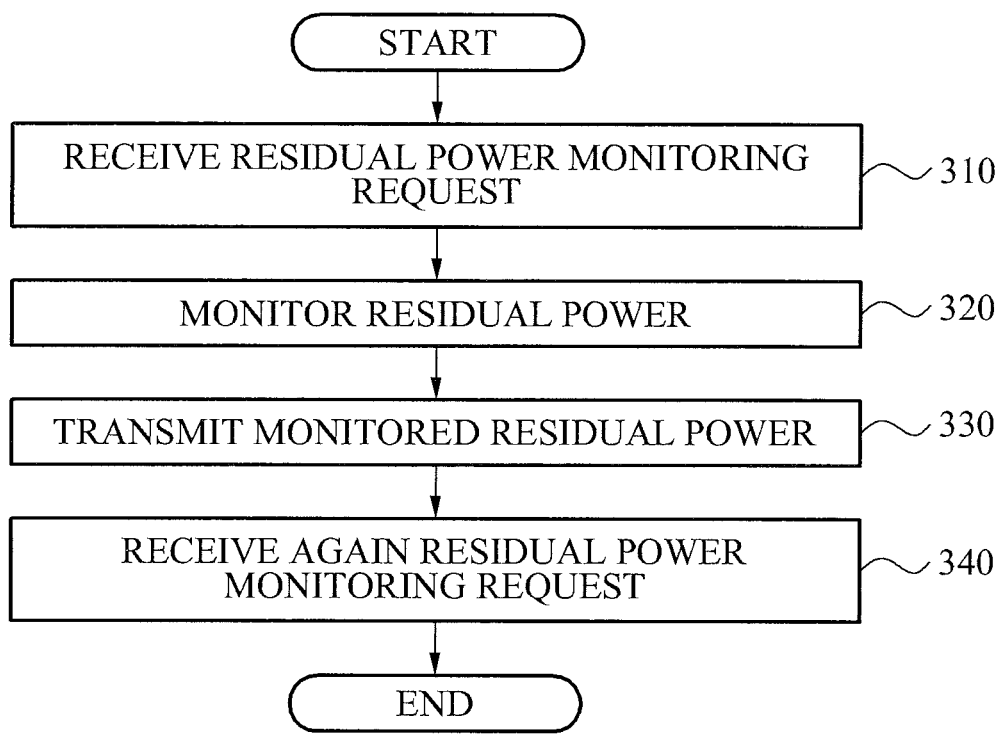
FIG. 3 is a flowchart illustrating an operation method of a machine type communication device according to an embodiment of the present invention.

FIG. 3 is a flowchart illustrating an operation method of a machine type communication device according to an embodiment of the present invention.

In operation 310, the machine type communication device may receive, from a network apparatus, a residual power monitoring request with respect to a battery of the machine type communication device. According to an aspect, the machine type communication device may implement one of gas meter reading, water gauge reading, safety inspection of a bridge, monitoring of water quality, measuring of water quantity of the river, and the like.

In operation 320, the machine type communication device may monitor a residual power of the battery.

In operation 330, the machine type communication device may transmit the monitored residual power of the battery to the network apparatus in response to the residual power monitoring request.

According to an aspect, the network apparatus may compare the residual power of the battery with a predetermined threshold. When the residual power of the battery is less than the threshold, the battery of the machine type communication device may be replaced with a new battery, or may be charged.

According to an aspect, when the residual power of the battery is less than the threshold, the network apparatus may transmit, to a terminal of a manager, a notification indicating that the residual power of the battery is insufficient, for example, low.

According to an aspect, the manager may verify the residual power of the battery of the machine type communication device via the terminal of the manager, and may replace the battery of the machine type communication device with the new battery or may charge the battery of the machine type communication device.

In operation 340, the machine type communication device may receive again a residual power monitoring request from the network apparatus at the reset residual power monitoring time.

According to an aspect, the network apparatus may compare the monitored residual power of the battery with the threshold, and may set a point in time when the residual power monitoring request is to be retransmitted based on the comparison result. According to an aspect, when the residual power of the battery is greater than or equal to the threshold, the network apparatus may predict a time duration in which the machine type communication device is sufficiently operable using current residual power of the battery and then, may set, as a subsequent monitoring time, a predetermined point in time within the predicted time duration.

Figure 4:
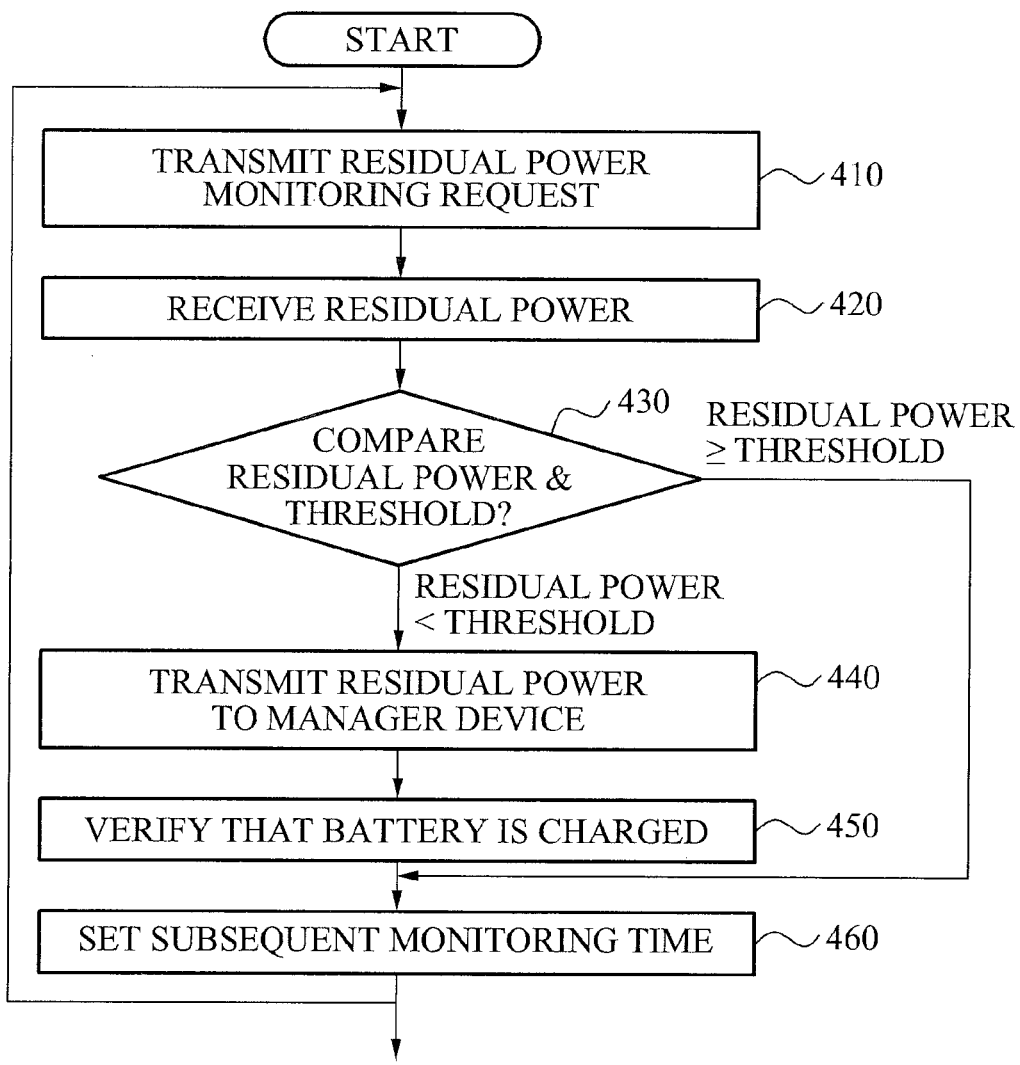
FIG. 4 is a flowchart illustrating an operation method of a network apparatus according to an embodiment of the present invention.

FIG. 4 is a flowchart illustrating an operation method of a network apparatus according to an embodiment of the present invention.

In operation 410, the network apparatus may transmit a residual power monitoring request to a machine type communication device. According to an aspect, the network apparatus may set a point in time when the residual power monitoring request is to be transmitted with respect to a battery of the machine type communication device, based on a battery power of the machine type communication device and a residual power of the battery thereof. In this case, the network apparatus may transmit the residual power monitoring request to the machine type communication device at the set point in time.

In operation 420, the network apparatus may receive a residual power of the battery of the machine type communication device from the machine type communication device in response to the residual power monitoring request.

In operation 430, the network apparatus may compare the residual power of the battery of the machine type communication device with a predetermined threshold. When the residual power of the battery of the machine type communication device is greater than or equal to the threshold, the network apparatus may set a point in time when the residual power monitoring request is to be retransmitted with respect to the battery of the machine type communication device.

Conversely, when the residual power of the battery of the machine type communication device is less than the threshold, the network apparatus may transmit the residual power of the battery to a terminal of a manager managing the machine type communication device or the network apparatus.

According to an aspect, the network apparatus may transmit, to the device of the manager managing the machine type communication device or the network apparatus, a residual power insufficient notification indicating that there nearly comes a time duration in which the machine type communication device is operable with the residual power of the battery.

The manager may verify the residual power of the battery of the machine type communication device using the terminal of the manager. According to an aspect, the manager may replace the battery of the machine type communication device with the new battery or charge the battery of the machine type communication device.

In operation 450, the network apparatus may verify that the battery of the machine type communication device is replaced with the new battery or that the battery of the machine type communication device is charged. According to an aspect, the network apparatus may receive, from the device of the manager, a battery charge verification message or a battery replacement verification message.

In operation 460, the network apparatus may set a point in time when the residual power of the battery of the machine type communication device is to be monitored again. According to an aspect, the network apparatus may predict a time duration in which the machine type communication device is operable using the monitored residual power of the battery of the machine type communication device. Also, the network apparatus may set, as the subsequent monitoring time, a predetermined point in time within the time duration in which the machine type communication device is operable. In operation 410, the network apparatus may retransmit a residual power monitoring request to the machine type communication device at the set subsequent monitoring time. According to an aspect, in response to the retransmitted residual power monitoring request, the network apparatus may receive again the residual power of the battery from the machine type communication device in operation 420.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An operation method of a machine type communication device using a power stored in a battery, in a network comprising at least one machine type communication device, the method comprising:
   receiving, from a network apparatus included in the network, a residual power monitoring request with respect to the battery;
   monitoring a residual power of the battery in response to the residual power monitoring request;
   transmitting the monitored residual power of the battery to the network apparatus in response to the residual power monitoring request; and
   receiving again a residual power monitoring request from the network apparatus based on the monitored residual power,
   wherein the network apparatus compares the residual power of the battery with a predetermined threshold, when the residual power of the battery is less than the threshold value, the network apparatus transmits comparison result to a device of a manager that manages the machine type communication device or the network apparatus, and
   when the battery is charged or replaced with a new battery based on the comparison result and thus the residual power of the battery is recovered greater than or equal to the threshold value, the device of manager transmits a response which indicates the battery recovered greater than or equal to the threshold to the network apparatus.

2. The method of claim 1, wherein the receiving gain the residual power monitoring request comprises receiving again the residual power monitoring request at a point in time that is predetermined based on the monitored residual power.

3. The method of claim 2, wherein the point in time that is determined based on the monitored residual power is set to be within a time duration in which the machine type communication device is operable with the monitored residual power.

4. An operation method of a network apparatus operating in a network comprising at least one machine type communication device, the method comprising:
   transmitting, to a machine type communication device, a residual power monitoring request with respect to a battery of the machine type communication device at a point in time for monitoring a residual power with respect to the machine type communication device;
   receiving the residual power of the battery from the machine type communication device in response to the residual power monitoring request;
   retransmitting, to the machine type communication device, a residual power monitoring request with respect to the battery based on the residual power of the battery;
   comparing the residual power of the battery received from the machine type communication device with a predetermined threshold;
   transmitting the comparison result to a device of a manager that manages the machine type communication device or the network apparatus when the residual power of the battery is less than the threshold value;
   receiving a response which indicates the battery is recovered greater than or equal to the threshold value from the device of manager when the battery is charged or is replaced with a new battery and thus recovered greater than or equal to the threshold value.

5. The method of claim 4, further comprising:
   predicting an operable time duration using the residual power of the battery when the residual power of the battery is greater than or equal to the threshold; and
   setting a predetermined time within the operable time duration as a subsequent monitoring time,
   wherein the retransmitting comprises retransmitting the residual power monitoring request at the set subsequent monitoring time.

6. An operation method of a network apparatus operating in a network comprising at least one machine type communication device, the method comprising:
   predicting an operable time duration in which a machine type communication device operating with a battery is operable using a residual power of the battery, with respect to the machine type communication device;

setting a predetermined point in time within the operable time duration to a monitoring time;

transmitting, to the machine type communication device at the set monitoring time, a residual power monitoring request with respect to the battery;

receiving, from the machine type communication device in response to the residual battery monitoring request, the residual power of the battery monitored at the monitoring time comparing the received residual power of the battery with a predetermined threshold;

transmitting a notification indicating a low residual power of the battery to a device of a manager that manages the machine type communication device of the network apparatus when the residual battery of the battery is less than the threshold value;

receiving a response which indicates the battery is recovered greater than or equal to the threshold from the device of manager when the battery is charged or replaced with a new battery and thus greater than or equal to the threshold.

* * * * *